United States Patent

Steigerwald et al.

[11] Patent Number: 5,912,809
[45] Date of Patent: Jun. 15, 1999

[54] PRINTED CIRCUIT BOARD (PCB) INCLUDING CHANNELED CAPACITIVE PLANE STRUCTURE

[75] Inventors: Todd W. Steigerwald; Leroy Jones, both of Austin, Tex.

[73] Assignee: Dell USA, L.P., Round Rock, Tex.

[21] Appl. No.: 08/786,581

[22] Filed: Jan. 21, 1997

[51] Int. Cl.⁶ ................................................. H05K 1/11
[52] U.S. Cl. .......................... 361/780; 361/794; 333/12; 174/255; 174/262
[58] Field of Search .................................... 361/777, 780, 361/794, 818; 333/12, 246; 174/255, 261, 262; 257/691, 700, 728

[56] References Cited

U.S. PATENT DOCUMENTS

| | | | |
|---|---|---|---|
| 4,449,174 | 5/1984 | Ziesse ........................................ | 363/21 |
| 4,927,742 | 5/1990 | Kohm ....................................... | 430/311 |
| 5,010,641 | 4/1991 | Sisler ........................................ | 29/830 |
| 5,025,116 | 6/1991 | Kawakami et al. ..................... | 174/250 |
| 5,030,800 | 7/1991 | Kawakami et al. ..................... | 174/264 |
| 5,079,069 | 1/1992 | Howard et al. .......................... | 428/209 |
| 5,112,648 | 5/1992 | Okonogi et al. ......................... | 427/96 |
| 5,140,110 | 8/1992 | Nakagawa et al. ..................... | 174/250 |
| 5,155,655 | 10/1992 | Howard et al. .......................... | 361/303 |
| 5,161,086 | 11/1992 | Howard et al. ....................... | 361/321.1 |
| 5,173,150 | 12/1992 | Kanaoka et al. ........................ | 156/630 |
| 5,196,230 | 3/1993 | Okonogi et al. ......................... | 427/96 |
| 5,236,736 | 8/1993 | Kawakami et al. ..................... | 427/96 |
| 5,261,153 | 11/1993 | Lucas ....................................... | 29/830 |
| 5,262,596 | 11/1993 | Kawakami et al. ..................... | 174/261 |
| 5,291,653 | 3/1994 | Ichikawa ................................. | 29/846 |
| 5,293,004 | 3/1994 | Kawakami et al. ..................... | 174/250 |
| 5,324,766 | 6/1994 | Ikejiri et al. ............................. | 524/433 |
| 5,416,667 | 5/1995 | Ichikawa et al. ....................... | 361/816 |
| 5,418,690 | 5/1995 | Conn et al. .............................. | 361/794 |
| 5,428,506 | 6/1995 | Brown et al. ........................... | 361/794 |
| 5,494,781 | 2/1996 | Ohtani et al. ........................... | 430/313 |
| 5,500,789 | 3/1996 | Miller et al. ............................ | 361/816 |
| 5,633,479 | 5/1997 | Hirano .................................... | 174/255 |
| 5,635,767 | 6/1997 | Wenzel et al. .......................... | 257/691 |
| 5,639,989 | 6/1997 | Higgins, III .......................... | 174/35 R |
| 5,682,124 | 10/1997 | Suski .......................................... | 333/1 |

OTHER PUBLICATIONS

Howard W. Johnson, Ph.D. and Martin Graham, Ph.D. "*High-Speed Digital Design: A Handbook of Black Magic*", 1993, pp. 189–221.

*Primary Examiner*—Leo P. Picard
*Assistant Examiner*—John B. Vigushin
*Attorney, Agent, or Firm*—Skjerven, Morrill, MacPherson, Franklin, & Friel, L.L.P.; Ken J. Koestner

[57] ABSTRACT

Electrical potentials and very high frequency (VHF) currents in a circuit board are controlled by patterning the power plane of a multiple layered, capacitive plane printed circuit board in selected geometric patterns. The selected geometric patterns, both simple and complex, control voltages and currents by channeling the capacitance capacity for usage directed to a particular integrated circuit or circuits, isolated to a particular integrated circuit or circuits, or shared between integrated circuits. Accordingly, the capacitive planes including the geometrically patterned power plane are channeled capacitive planes (CCP) that are formed on multiple layers of a single printed circuit board to support flexible, three-dimensional control of VHF electrical currents.

34 Claims, 11 Drawing Sheets

Parallel Plate Capacitor $$K = \frac{M}{\sqrt{L_1 L_2}}$$

$$K = 1 - \frac{L_{closed}}{L_{open}}$$

$$K = \frac{L_a - L_b}{4\sqrt{L_1 \cdot L_2}}$$

$$K = \frac{L_a - L_b}{L_a + L_b}$$

Assuming L1 = L2

L=plane inductance
R=plane resistance
M=coplanar mutual inductance
C=coplanar mutual capacitance
G=coplanar mutual conductance

PRINTED CIRCUIT BOARD (PCB) INCLUDING CHANNELED CAPACITIVE PLANE STRUCTURE

BACKGROUND OF THE INVENTION

1. Field of the Invention

The present invention relates to printed circuit boards for usage in electronic systems such as computer systems. More specifically, the present invention relates to capacitive plane printed circuit board (PC-PCB) structures for suppressing electromagnetic fields and stabilizing integrated circuits.

2. Description of the Related Art

Multiple layer printed circuit boards (PCBs) are used in computer systems for interconnecting integrated circuit (IC) chips and other electronic components and devices. A multiple layered printed circuit board is formed from a substrate supporting a plurality of insulated conductive trace layers. The insulated trace layers typically include surface conductive trace layers and embedded trace layers with selected trace layers connected as a ground plane and a power plane. Integrated circuits and electronic components and devices are mounted on an outer surface of the multiple layered printed circuit board and selectively connected to the trace layers by plated-through holes called vias.

A problem arising with multiple layered printed circuit boards is that the electronic operation of integrated circuits includes switching that results in high frequency fluctuations in the potential difference between the power plane and the ground plane. This problem has been addressed using bypass capacitors connected between the power plane and the ground plane and mounted in the general vicinity of each integrated circuit. The bypass capacitors are generally effective in reducing and stabilizing voltage fluctuations for low frequency voltage oscillations below about 200 MHz. Unfortunately, a via connection of a bypass capacitor to the power and ground planes introduces a small inductance that impedes the bypass function of a bypass capacitor and reduces the effectiveness of the bypass capacitor to stabilize voltage fluctuations at higher frequencies. The poor high frequency performance of bypass capacitors is particularly unsuited for today's integrated circuits that have higher EMI spectrum and power plane current demands in the Very High Frequency (VHF) band range above 200 MHz. Conventional decoupling components such as through-hole and surface mount technology capacitors have an effective range of frequencies that is considerably below the 200 MHz range.

Other characteristics of recent-technology integrated circuits render bypass capacitors unsuitable for usage with recent technology. New integrated circuits are clocked at higher rates as illustrated by the rapid ascension of operating frequency of microprocessors. The size of integrated circuits is decreasing and, as die size decreases, the spectral content of operating circuits increases, escalating the VHF current demand. In addition, an increasing percentage of components in recent synchronous computer designs operate at the high clock speeds of processors using connection to high-speed buses such as the Intel PCI bus and the VESA VL bus. These characteristics create very high speed current demands in many geometric locations of a circuit board or printed circuit board (PCB).

Various structures and techniques for filtering or decoupling voltage fluctuations have been used to improve electromagnetic field suppression and stabilize voltages in high speed circuits. Previously the electronics industry has used traditional industry filtering or choking of power or signals in integrated circuits. Choking coils utilize an inductor to present a relatively high impedance to an alternating current to reduce the amount of voltage fluctuation in circuits. Ferrite cores are structures constructed from low-density ceramic materials having a very low eddy-current loss for reducing voltage fluctuations in circuits. Decoupling capacitors and various filters including RC, RCR and RCL circuits are liberally used in high numbers in traditional or printed circuit boards. The traditional structures and techniques have severe functional limitations and limitations of theoretical physics as printed circuit board speed increases.

Problems with the performance of bypass capacitors, chokes, filters and decouplers have been addressed using capacitive plane (CP) structures to control voltage fluctuations and improve electromagnetic field suppression using the physical and electronic theory of Planar Mutual Inductive Coupling (PMIC). The capacitive plane design approach allows high speed VHF energy to flow back and forth across the plane with minimum high frequency resistance or phase imbalance, thereby creating less waste. Electromagnetic fields are caused by this high frequency energy waste and phase imbalance so that reduction of waste suppresses EMI.

The disadvantages of bypass capacitors are addressed by Sisler, J. in U.S. Pat. No. 5,010,641, entitled "Method of Making Multilayer Printed Circuit Board", issued Apr. 30, 1991 by making a multilayer printed circuit board with sufficient internal distributed capacitance to eliminate the need for a bypass capacitor mounted in the vicinity of each integrated circuit mounted to the board. The method includes providing one or more fully-cured power-ground plane sandwich components with are laminated together with other partially cured component layers of the board. Each sandwich component includes a conductive power plane layer and a conductive ground plane layer separated by a fully cured dielectric material. The thickness of the dielectric layer of each sandwich is chosen to be sufficiently thin to supply a desired distributed capacitance.

What is needed is a structure and technique for improving electromagnetic field suppression and stabilizing voltages applied to integrated circuits mounted on a multiple layered, capacitive plane printed circuit board. What is further needed is a system and method for VHF current delivery and return to meet system design requirements for highspeed circuits such as microprocessor circuits.

SUMMARY OF THE INVENTION

It has been discovered that electrical potentials and very high frequency (VHF) currents in a circuit board are controlled by patterning the power plane of a multiple layered, capacitive plane printed circuit board in selected geometric patterns. The selected geometric patterns, both simple and complex, control voltages and currents by channeling the capacitance capacity for usage directed to a particular integrated circuit or circuits, isolated to a particular integrated circuit or circuits, or shared between integrated circuits. Accordingly, the capacitive planes including the geometrically patterned power plane are channeled capacitive planes (CCP) that are formed on multiple layers of a single printed circuit board to support flexible, three-dimensional control of VHF electrical currents.

In accordance with a first aspect of the present invention, a plurality of individual power planes are formed in a or printed circuit board and the EMI fluxes of the individual power planes are channeled or directed within a single capacitive plane pair to allow a plurality of potentials and integrated circuits which form loads applied to the plurality of potentials to improve electromagnetic field suppression and stabilize voltages applied to integrated circuits. The multiple potential capacitive planes are formed on a plurality of layers in a single multiple layer or printed circuit board (PCB) design and direction of the EMI fluxes includes an effect of channeling EMI fluxes from layer to layer within the printed circuit board.

In accordance with a second aspect of the present invention, the isolation of a capacitive plane pair is determined by the thickness of an intermediate distance between parallel conductive layers that form power planes of a capacitive plane pair and the permittivity of the material within the intermediate distance. The mutual inductance and frequency response of the capacitive plane is controlled by controlling the distance between conductive layers for various applications. In one example, the distance between the parallel conductive layers is controlled to reduce power plane radio frequency (RF) crosstalk at the interface between a processor and an audio interface within a computer system, thereby improving signal-to-noise ratio of the system.

In accordance with a third aspect of the present invention, capacitive planes that are smaller in area than the entire printed circuit board share the usage of a particular layer or layers among other interconnections including buses, slow logic, and clock microstrip systems. Shared usage of capacitive planes advantageously promotes flexibility in usage of the multiple layers, increasing the efficiency of printed circuit board design.

In accordance with a fourth aspect of the present invention, capacitive planes control the usage of radio frequency (RF) power, facilitating RF design efficiency. Control of RF power yields advantages throughout an electronic system including improvements ranging from logic signal quality mechanical shielding design.

In accordance with these aspects of the present invention, complex and simple geometric patterns within the voltage plane half of a capacitive power plane pair occurring in multiple layers within a single printed circuit board. A plurality of individual potentials and a plurality of individual very high frequency electrical currents traveling in the multiple layers are directed, isolated, shared and controlled. The behavior of this capacitive plane or printed circuit board structure includes capacitive features of high speed capacitors and inductive features of a microstrip line.

Many advantages are achieved by the described channeled capacitive plane (CCP) structures and operating method. The channeled capacitive plane structures reduce radiation loop areas for improved EMI source suppression. The channeled capacitive plane structures are implemented to increase the geometric efficiency of integrated circuit layout to achieve smaller areas of VHF electrical current travel.

Some integrated circuit designs utilize the supply of multiple voltage levels to a single board and generate multiple different EMI noise signals from complex loads that are shared among multiple circuit paths. The illustrative channeled capacitive plane structures advantageously supports an optimal design of three-dimensional PCB power plane structures while minimizing radiation loop areas in two or three dimensions.

The described channeled capacitive plane structures are advantageously implemented to mutually isolate particular high frequency electromagnetic fields with a controlled precision. The channeled capacitive plane structures are formed to control the precise amount of VHF isolation that occurs in the design of a printed circuit board without wasting area in a power plane.

It is highly advantageous that the channeled capacitive plane improves predictability in controlling electromagnetic interference (EMI). The channeled capacitive plane structures reduce the number of capacitive components, thereby reducing the size, weight, metal content, and cost of electronic systems.

The combined advantages of channeled capacitive plane structures lead to radio frequency systems that produce cleaner, noise-resistant signals with highly flexible design.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings. The use of the same reference symbols in different drawings indicates similar or identical items.

DESCRIPTION OF THE ILLUSTRATIVE EMBODIMENT(S)

Figure 1:
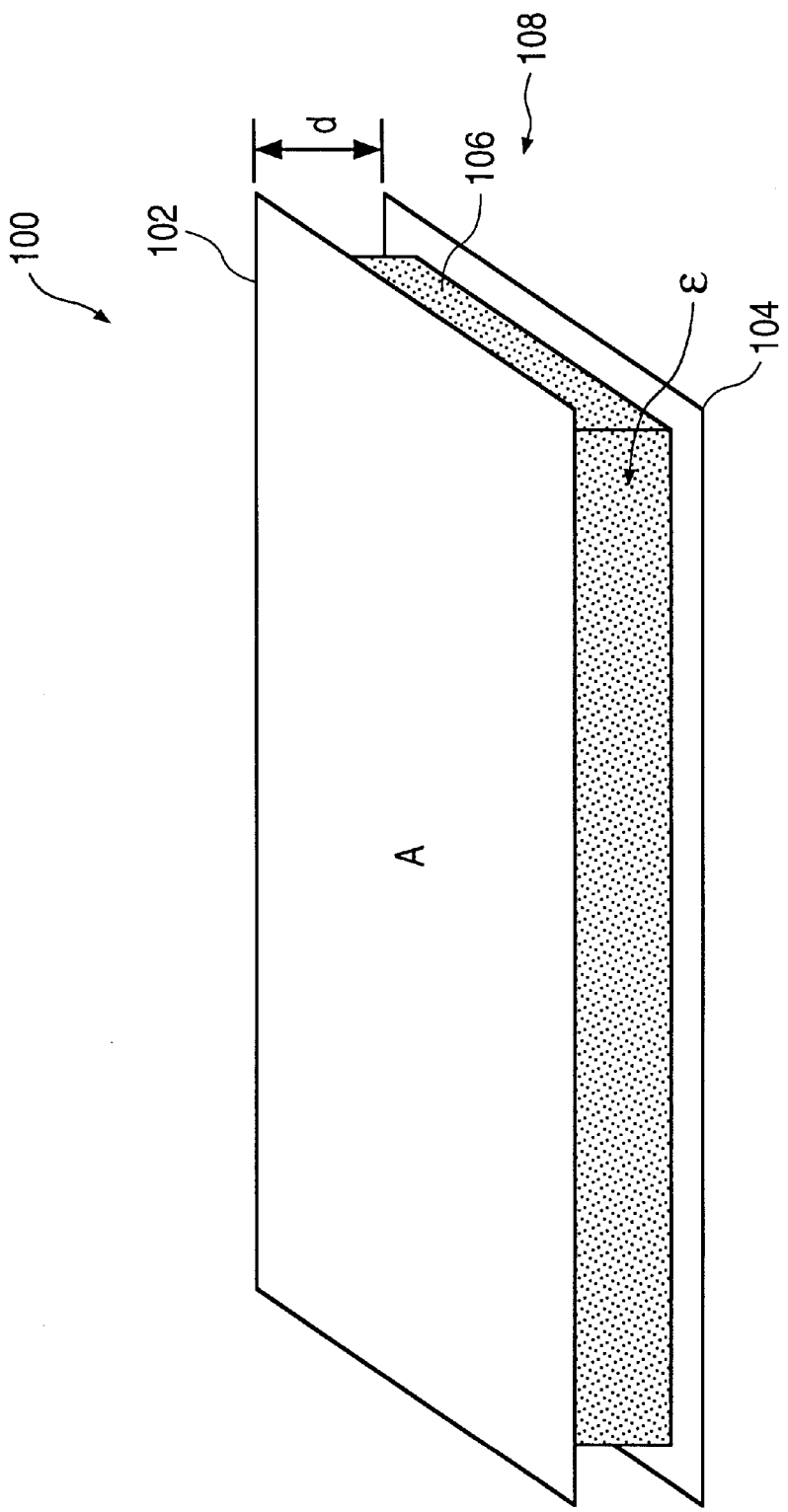
FIG. 1 is a side perspective view of a parallel plate capacitor is shown which includes two conductive layers separated by dielectric layer.

Referring to FIG. 1, a side perspective view of a parallel plate capacitor 100 is shown which includes two conductive layers 102 and 104 separated by dielectric layer 106. A capacitive plane 108 is created when two conductive layers 102 and 104 are displaced within a particular proximity to one another that each layer mutually induces current in the other layer at very high frequencies. The illustrative parallel plate capacitor 100 is a FR4-Cu capacitor with suitable precision and high speed. The dimensions of the dielectric layer 106 are controlled so that the parallel plate capacitor 100 decouples signals between active devices, communication channels, circuits and components as desired.

Furthermore, the parallel plate capacitor 100 is constructed to carry VHF current from one place to another in a selective manner and to change the characteristic impedance of an integrated circuit die.

The parallel plate capacitor 100 physically functions on the basis of planar mutual inductive coupling which states theoretically that the area (A) of the plates formed by the conductive layers 102 and 104, the distance (d) between the plates, and the permittivity ($\epsilon$) of the dielectric layer 106 determine the mutual capacitance (C) between the planes. In particular, the mutual capacitance (C) is given by equation (1) as follows:

$$C = \epsilon A / d.$$

Figure 2:
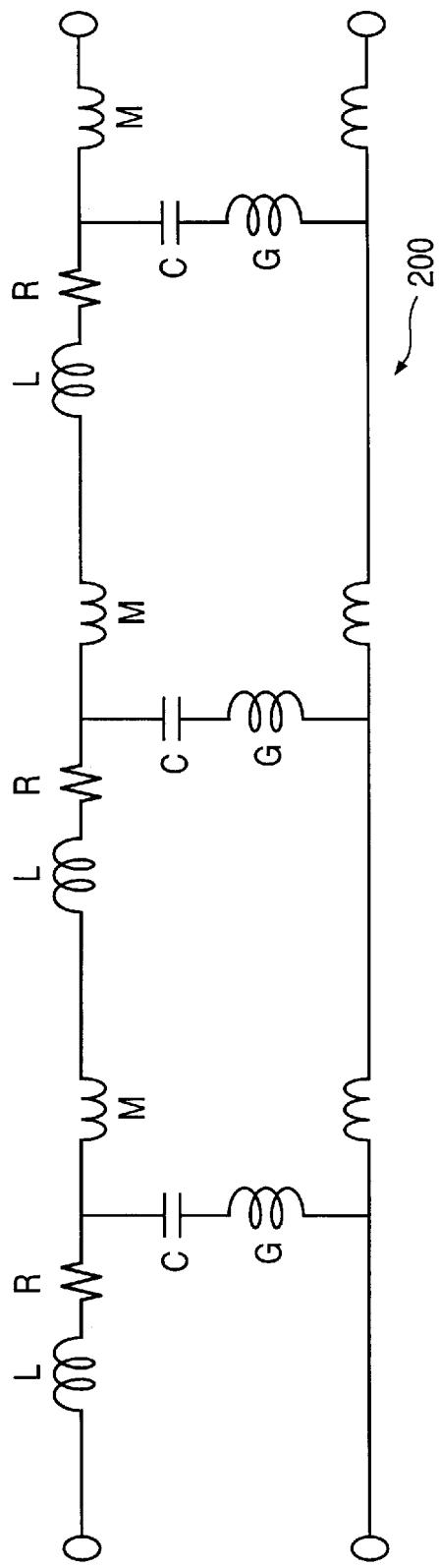
FIG. 2 is a schematic circuit diagram illustrating an equivalent circuit behavior of the parallel plate capacitor.
Figure 2:
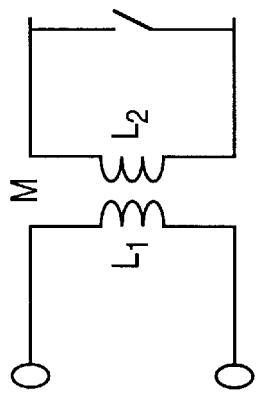

The interplanar spacing (d) and the frequency ($\omega$) determine the mutual RF coupling of a circuit. Referring to FIG. 2, a schematic circuit diagram illustrates an equivalent circuit behavior of the parallel plate capacitor 100. The parallel plate capacitor 100 forms a mutually inductive circuit of channeled capacitive power planes 200 exhibiting several characteristic parameters including a plane inductance (L), a plane resistance (R), a coplanar mutual inductance (M), a coplanar mutual capacitance (C), and a coplanar mutual conductance (G). The mutual inductance of the channeled capacitive power planes 200 is described by a constant K, in which:

$$K = M / \sqrt{L_1 L_2},$$

where $L_1$ and $L_2$ express the plane inductance as shown.

Referring again to FIG. 1, the parameters $\epsilon$, A, and d of the parallel plate capacitor 100 are selected to control the frequency response of the parallel plate capacitor 100. The distance (d) between the copper (Cu) plates is also selected to control the mutual inductance and the frequency response of the planes. While conventional bypass capacitors fail to decouple signals from different integrated circuits effectively above 250 MHz, an illustrative parallel plate capacitor 100 suitably decouples signals generated by integrated circuits performing at a rate exceeding 1.3 GHz when the thickness (d) of the dielectric layer 106 is about 4 mil FR4, and the thickness of the copper layers (Cu) is approximately 1.4 mil. The thickness (d) of the dielectric layer 106 typically is in the range of 5–6 mil and is selected not only on the basis of performance of the parallel plate capacitor 100 but also on the basis of manufacturability since very thin thicknesses (d) are difficult to fabricate. Thicknesses (d) in the range of 2 mil to 20 mil are useful. A thinner dielectric layer generally increases the frequency response. For example, a dielectric layer 106 thickness of 3 mil increases the frequency response beyond 1.5 GHz.

Figure 3:
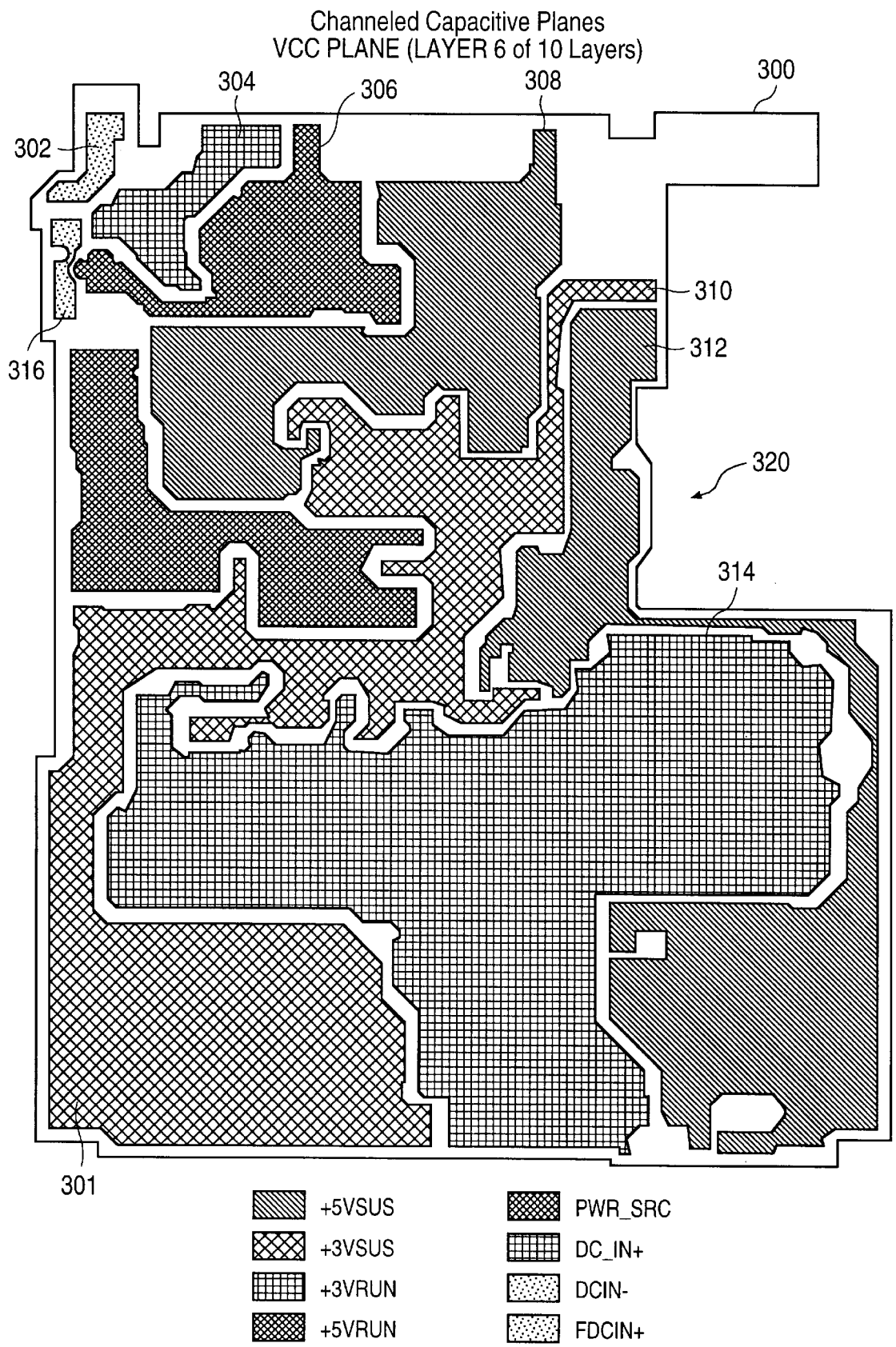
FIG. 3 is a top view of a sample circuit board illustrating integrated circuit placement and voltage requirements.

Referring to FIG. 3, a top view of a sample circuit board 300 illustrates integrated circuit placement and voltage requirements. The sample circuit board 300 implements three-dimensional channeled capacitive plane structures to achieve three-dimensional VHF power channeling in a multiple-layer, multiple-potential printed circuit board. The illustrative structure of the sample circuit board 300 is formed by etching a copper plate conductive layer 301 into a mosaic pattern and connecting segments isolated by the etching selectively to various power supply voltages. The structure of the mosaic pattern in the plane of the copper plate conductive layer 301 is determined by considering a suitable layout of integrated circuit chips on a planar surface of the sample circuit board 300. The mosaic pattern is structured to supply appropriate power signals to the integrated circuit chips, but also to form a suitable structure of channeled capacitive planes. The mosaic pattern is structured to deliver appropriate power accurately but also to return virtually all of the delivered power, essentially eliminating power loss and power radiation.

Layout of the integrated circuit chips is selected to distribute electromagnetic interference and noise suitably across the sample circuit board 300. In particular, some integrated circuits generate a high radio frequency power. Other circuits are very quiet. The integrated circuits are distributed according to the known RF behavior of the circuits and the multiple-layer capacitive planes are structured to channel current to decouple voltage fluctuations among the integrated circuits and active components mounted on a circuit board. For example, a computer circuit generally may include a central processing unit, a video controller, an audio controller, a system controller, and the like, which generate a large amount of radio frequency noise. The mosaic regions of the sample circuit board 300 are laid out to reduce the generated electromagnetic force and isolate noisy integrated circuits. For example, an audio integrated circuit (not shown) for generating suitable sound signals is position in a location distant from noisy circuits to produce suitable sound signals. Decoupling between the integrated circuits is supplied both by the channeled capacitive plane structures for high frequency signals and surface mount capacitors for lower frequency signals.

Dielectric layers (not shown) separate the copper plate conductive layer 301 from other conductive layers (not shown), typically both overlying and underlying the copper plate conductive layer 301, with vias interconnecting the various conductive layers to form a multipotential, three-dimensional structure. The conductive layers include a plurality of routing planes and ground planes. The VCC powered copper plate conductive layer 301 is separated from a solid ground potential conductive plate (not shown) by a dielectric layer (not shown) to form a power plane that controls electromagnetic interference and frequency response at very high frequencies. Similarly, a microstrip is formed to balance impedances by routing planes in the multiple plane structure. Microstrips are formed by a conductive plate which is separated from an associated solid ground potential conductive plate by a dielectric layer to control electromagnetic interference and frequency response at very high frequencies at multiple levels in the sample circuit board 300.

The structure is multipotential in the sense that multiple capacitive planes are formed. The multiple capacitive planes are usually powered by a power plane—specifically the copper plate conductive layer 301—that includes separate and distinct power sources. The multiple capacitive power planes include a separate and distinct load structure. The structure is three dimensional in the sense that separate and distinct power sources are distributed in a two-dimensional plane in the copper plate conductive layer 301 and multiple separate and distinct loads are distributed in a third dimension orthogonal to the plane of the copper plate conductive layer 301, all of which exhibit the advantageous characteristics of channeled capacitive planes.

The structure of the sample circuit board 300 is controlled by selecting the etch geometries of the copper plate conductive layer 301, the dielectric thicknesses between conductive planes in three dimensions, and interconnections between the layers to channel power. Power is channeled geometrically in three dimensions in the sample circuit board 300 in a predetermined, controlled pattern to form multiple capacitive planes.

The sample circuit board 300 includes a plurality of geometric shapes etched into a voltage half-plane 320, in particular a VCC power plane layer, of a printed circuit board 300. The segments 302 through 316 are separated to carry different power level signals, such as a 3.5V supply and a 5V supply, for example.

In some cases, multiple geometric regions are assigned the same power level so that a particular voltage supply may be supplied to different integrated circuits on a printed circuit board at different times.

Shapes of the segments 302 through 316 are defined using computer-aided design tools with different supply regions set forth in color drawings. The layout geometry for assigning locations of integrated circuit chips, the thicknesses of dielectric layers in the multiple layer boards, the geometry of segments in the power plane, the geometry of the capacitive plane segments in the signal planes, and the geometry of the layout of the signal lines are all taken into consideration to channel capacitive planes in the printed circuit board in three dimensions. Using this technique, power losses are highly reduced throughout the printed circuit board, electromagnetic interference is substantially reduced, and resonant characteristics of the printed circuit board are improved. In particular, by channeling current appropriately throughout the printed circuit board, the board resonates less and less power is lost to the resonance.

Conventional printed circuit board techniques are employed for depositing and etching the voltage half-plane 320 for interconnecting integrated circuit chips and components to appropriate power sources.

Figure 4A:
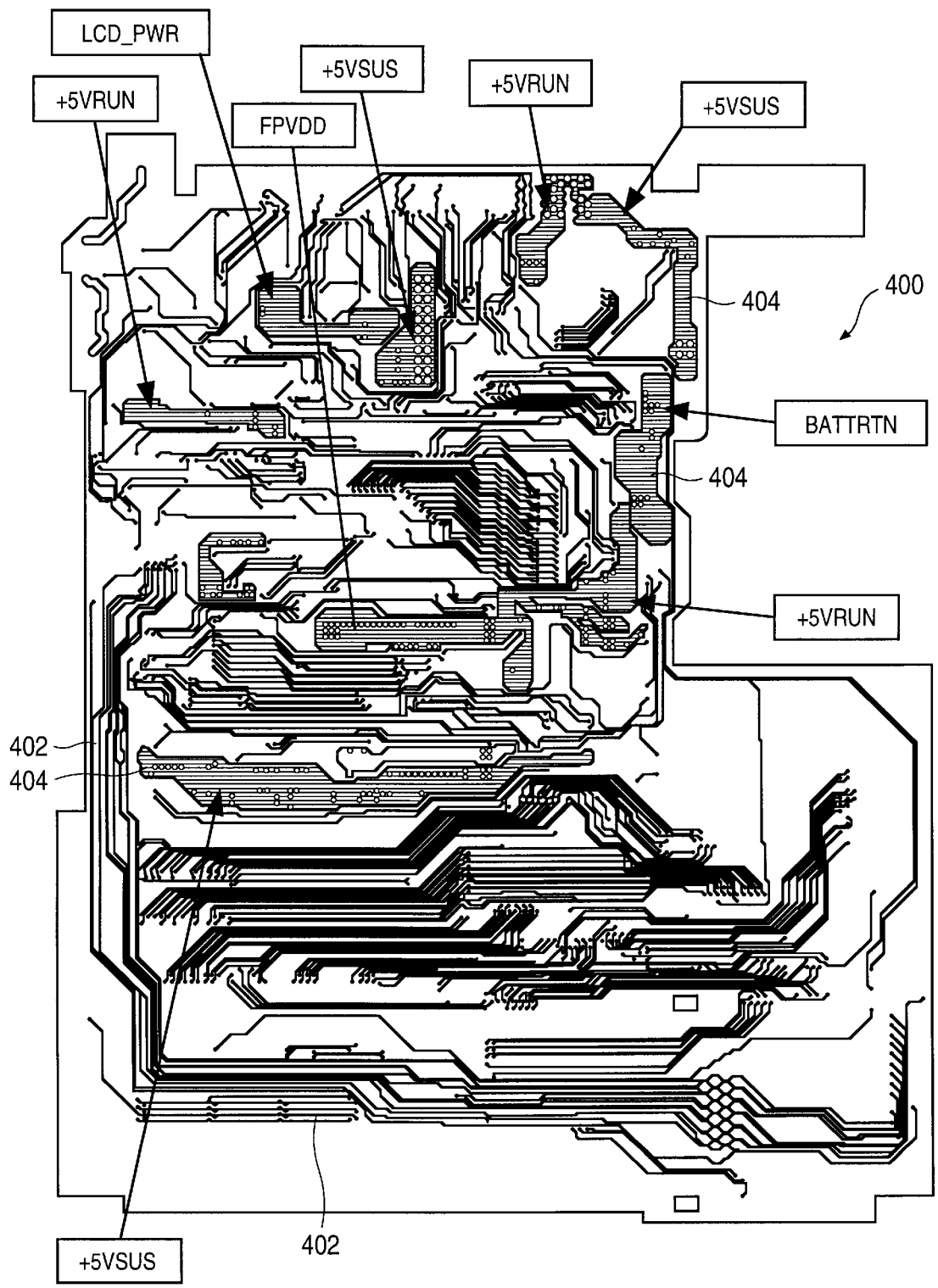
FIGS. 4A and 4B are top views of a sample circuit board illustrating channeled capacitive plane structure channels of two selected routing layers.
Figure 4B:
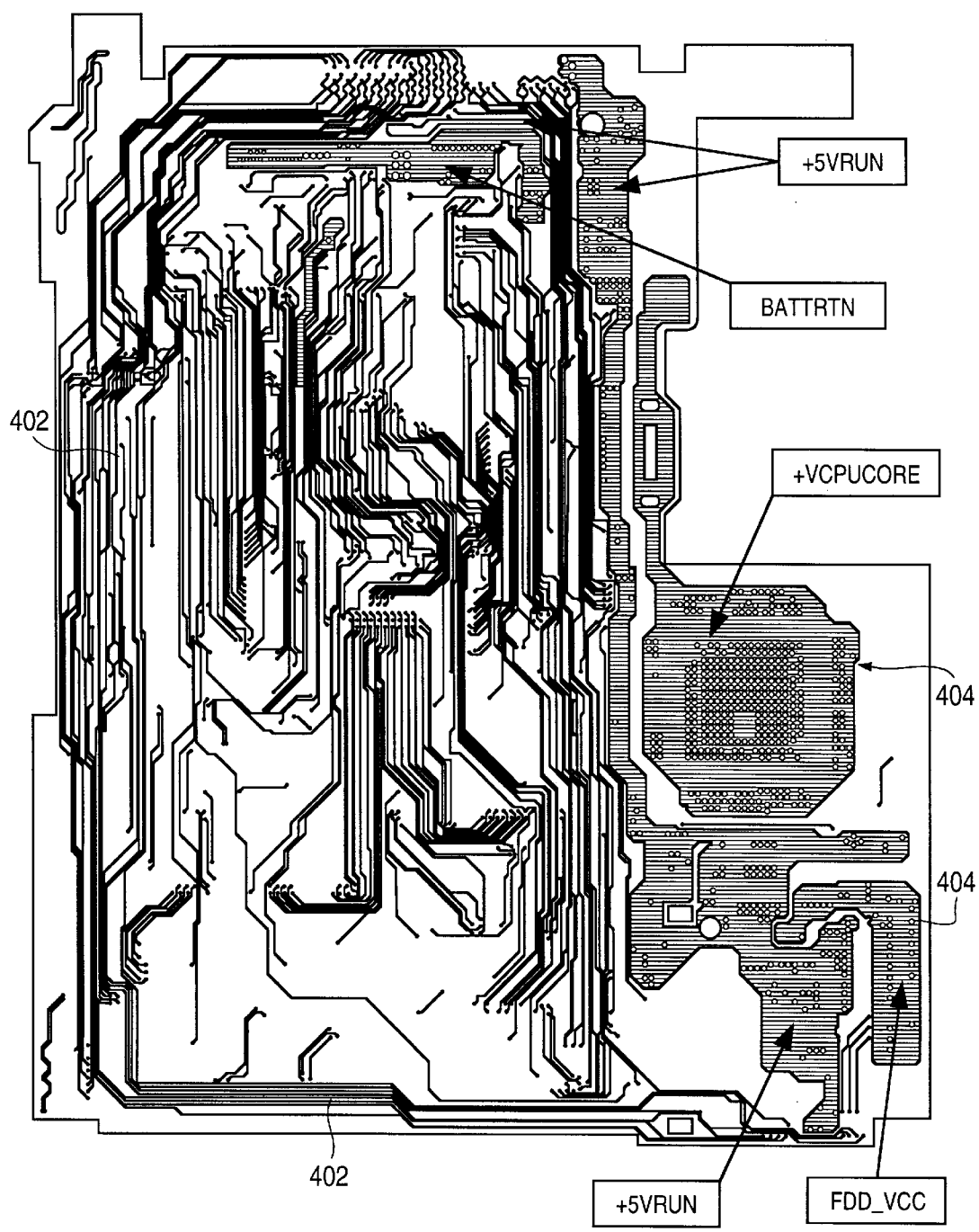
Figure 5:
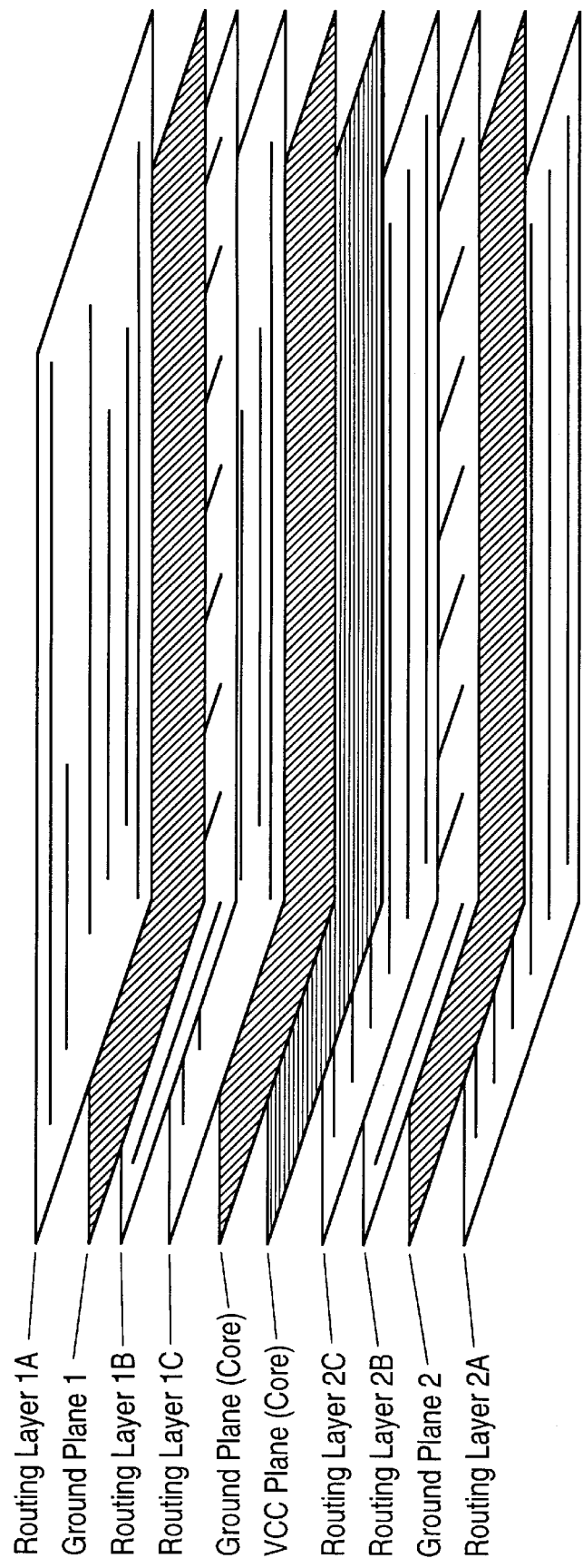
FIG. 5 is a pictorial side view which shows a side perspective view of the channeled capacitive plane structure channels for a ten layer circuit board.

Referring to FIGS. 4A and 4B, top views of a sample circuit board 400 illustrates channeled capacitive plane structure channels of selected routing layers. In the illustrative examples of FIGS. 4A and 4B, respective signal layers 7 and 8 of a ten-layer layout includes a plurality of signal lines 402 for conducting signals between integrated circuit chips and a plurality of capacitive plane segments 404 for channeling current throughout the sample circuit board 400 in three dimensions. Through the usage of complex and simple geometric patterns in the voltage half plane shown in FIG. 3 of a capacitive plane or printed circuit board structure, a plurality of potentials and the individual VHF electrical currents traveling in the or printed circuit board 400 are simultaneously controlled, including control of directed, isolated, and shared aspects of the currents. These patterns typically are formed in several selected layers of a printed circuit board. The several layers of a printed circuit board are illustrated in FIG. 5, which shows a side perspective view of the channeled capacitive plane structure channels for a ten layer circuit board.

The plurality of capacitive plane segments 404 are geometric structures formed in the conductive planes which are similar to the geometric structures in the voltage half plane so that current is not only channeled laterally throughout the sample circuit board 400 but also channeled suitably at all of the various levels of the multiple layer board.

The illustrative channeled capacitive plane structures produce radio frequency delivery and return of current with high efficiencies, approaching 100%.

The channeled capacitive plane structures in a or printed circuit board advantageously achieves RF phase coherence along particular selected paths. RF phase coherence is achieved on the basis that phase changes in positive and negative current flows produce radiated electromagnetic interference in clock systems. Likewise, similar phase changes in positive and negative current flows occur in the power delivery to the same clocking integrated circuiting so that phases are coherent.

Figure 6:
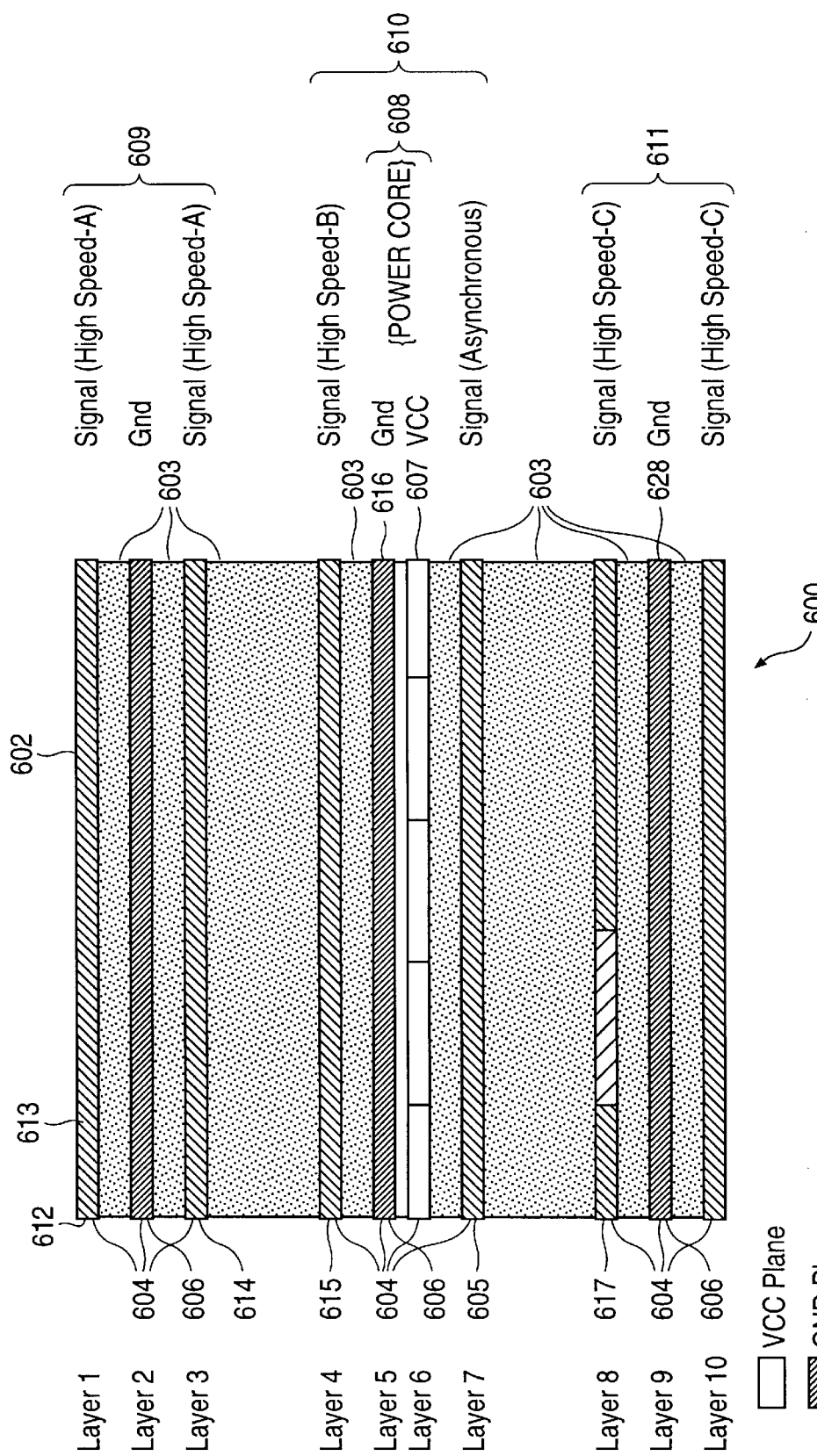
FIG. 6 is a cross-sectional view illustrating a multiple layer printed circuit board structure in the form of a ten-layer channeled capacitive plane stack.

Referring to FIG. 6, a cross-sectional view illustrates a multiple layer printed circuit board structure 600 in the form of a ten-layer channeled capacitive plane stack 602 having ten conductive layers separated by intermediate dielectric layers 603. The ten-layer channeled capacitive plane stack 602 is highly suitable for high-density, high-speed circuit boards. The ten conductive layers include five high-speed routing layers 604, one low-speed, asynchronous routing layer 605, three ground planes 606, and a VCC power plane 607. One of the ground planes 606 and the VCC power plane 607 form a capacitive plane power core 608 in the vicinity of the center of the multiple layer printed circuit board structure 600. The five high-speed routing layers 604 and the low-speed, asynchronous routing layer 605 are arranged into three paired layers with each pair associated with and straddling a ground plane 606. Each of the layers, A-layer 609, B-layer 610, and C-layer 611 include the central ground plane 606 because the impedance of all signals in the layer are referenced to ground. For high speed signals on conductive routine lines, the central ground plane 606 returns signal energy and cancels the signal to reduce electromagnetic interference.

The thicknesses of the intermediate dielectric layers 603 and the power and signal carrying conductive layers is set to selected capacitive thicknesses for matching impedances in the manner of a microstrip system. A microstrip is a strip of conducting material disposed in close proximity to a ground conducting plane. A microstrip is used as a transmission line in ultrahigh frequency applications. Typically a suitable capacitive plane is formed if a thickness of the intermediate dielectric layer 603 in a range from approximately 4 to 6 thousandths of an inch is deposited and the thickness is precisely deposited to achieve impedance matching between the signals carried on the conductive layers and the ground potential on the ground planes 606. In a highly suitable embodiment, the impedances are matched in each of the layers including the A-layer 609, the B-layer 610, and the C-layer 611, so that the impedances are matched in the high-speed signal layer 1 612 and the ground plane layer 2 613. Impedances are matched in the high-speed signal layer 3 614 and the ground plane layer 2 613. In the C-layer 611, impedances are matched in the high-speed signal layer 8 617 and the ground plane layer 9 618 and further in the in the high-speed signal layer 10 619 and the ground plane layer 9 618. The A-layer 609 and the C-layer 611 each form a signal microstrip for conveying signals and supplying current from selected source regions to selected destination regions of the multiple layer printed circuit board structure 600. In the B-layer 610, impedances are matched in the high-speed signal layer 4 615 and the ground plane layer 5 616 and further in the in the VCC power plane in layer 6 607 and the ground plane layer 5 616 to optimize the power supply to circuits connected to the multiple layer printed circuit board structure 600. Therefore, the described multiple layer structure advantageously serves as a high-speed signaling and current delivery system selectively supplying current to particular circuit regions in three-dimensions of a circuit board. The described multiple layer structure advantageously decouples voltage fluctuations among multiple integrated circuits and active components in a circuit implementation in a superior, three-dimensional geometry for very high frequencies of 200 MHz or faster. The multiple layer structure advantageously reduces the component part count for a circuit by reducing the number of bypass capacitors mounted on the surface of a board. Furthermore, the multiple layer structure advantageously decreases printed circuit board-induced electromagnetic interference (EMI) such as transverse electromagnetic wave phenomena.

The paired layers include an A-layer 609, a B-layer 610, and a C-layer 611. The A-layer 609 includes a high-speed signal layer 1 612, a ground plane layer 2 613, and a high-speed signal layer 3 614. The B-layer 610 includes a high-speed signal layer 4 615, a ground plane layer 5 616, the VCC power plane 607 in layer 6, and the low-speed, asynchronous routing layer 605 in layer 7. The C-layer 611 includes a high-speed signal layer 8 617, a ground plane layer 9 618, and a high-speed signal layer 10 619. Clock signals and other high speed signals are only routed on layers that share a common ground plane 606. The high-speed signal layer 4 615 is used to route signals that are also routed on the high-speed signals layers 1 612 and 3 614 only if no other layers are available. Signals routed on the A-layer 609 and/or the B-layer 610 typically do not route also on the C-layer 611 because such a condition necessitates routing of the signal on both sides of the capacitive plane power core 608. A capacitive plane structure acts as a barrier to microstripping since ground current cannot pass through the capacitive plane structure.

In various embodiments, the VCC power plane 607 is patterned so that channeled capacitive plane structures are formed in the five high-speed routing layers 604 and the low-speed, asynchronous routing layer 605, advantageously forming capacitive structures flexibly in strategic positions throughout a circuit design.

In the A-layer 609, the B-layer 610, and the C-layer 611, the thickness of the intermediate dielectric layers 603 between the conductive layers is selectively controlled to set geometric patterns of electromagnetic fluxes in the dimension orthogonal to the plane of the individual conductive and dielectric layers. Specifically, the thickness of each intermediate dielectric layer 603 is controlled separately to set the impedance of the power coupling. The thickness of the intermediate dielectric layers 603 on the two sides of the central ground plane 606 separating the ground plane 606 from powered or signal conductive layers determines the high frequency behavior of the A-layer 609, the B-layer 610, and the C-layer 611. The thickness of the intermediate dielectric layers 603 is controlled to tolerances of $\frac{1}{1000}$ inches using processing techniques that are well known in the art of printed circuit board fabrication.

The multiple conductive layers are interconnected by vias (not shown), including connections to the VCC power plane 607 and connections to the ground plane 606, with a suitable selected layout so that current and power are transferred between the planes, channeling current in the microampere range, power and signals between the planes.

Figure 7:
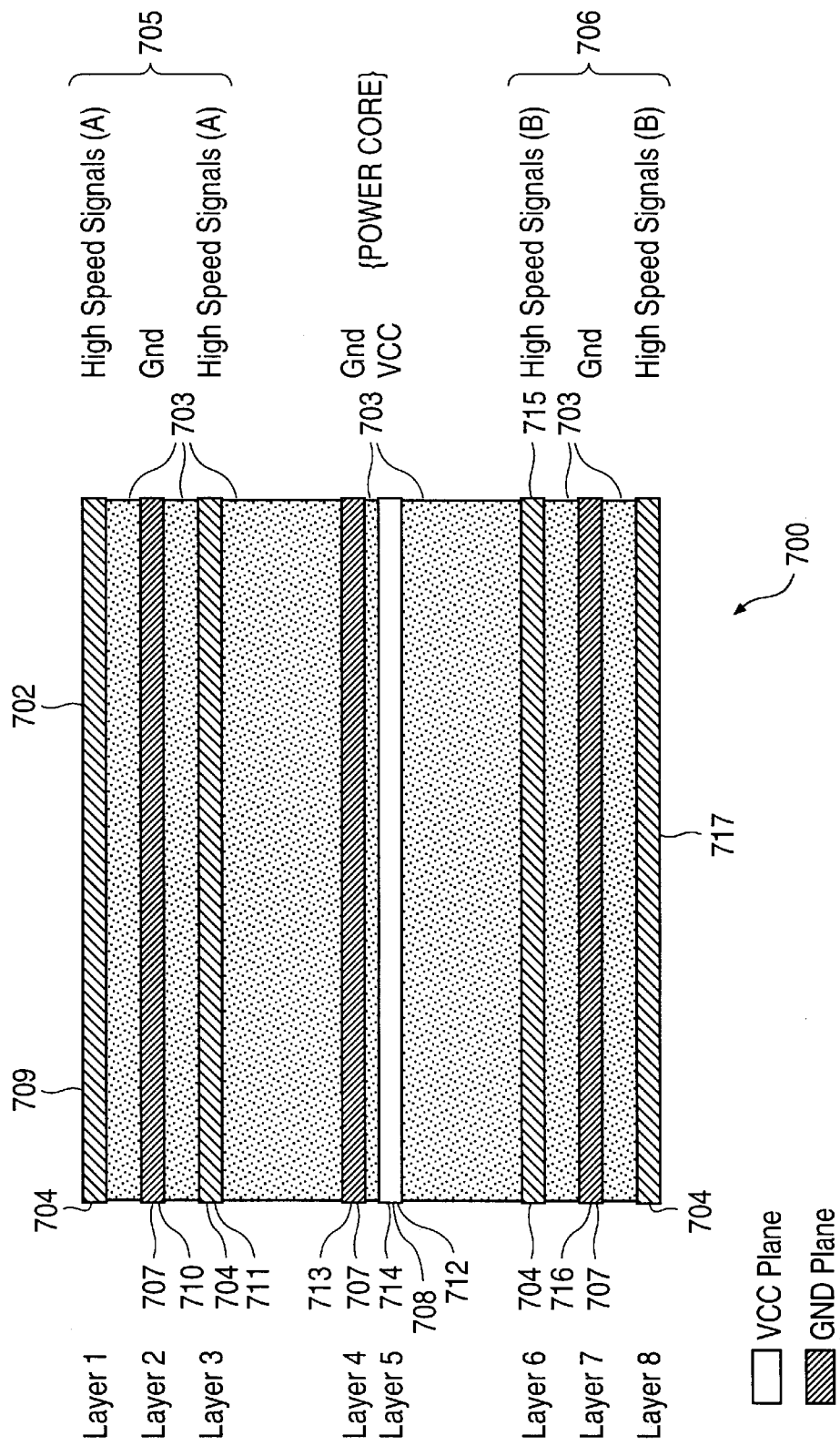
FIG. 7 is a cross-sectional view illustrating a multiple layer printed circuit board structure in the form of a eight-layer channeled capacitive plane stack.

Referring to FIG. 7, a cross-sectional view illustrates a multiple layer printed circuit board structure 700 in the form of an eight-layer channeled capacitive plane stack 702 having eight conductive layers separated by intermediate dielectric layers 703. The eight-layer channeled capacitive plane stack 702 is highly suitable for high-density, high-speed circuit boards. The eight conductive layers include four high-speed routing layers 704 arranged in two pairs forming an A-layer 705 and a B-layer 706, three ground planes 707, and a VCC power plane 708. The A-layer 705 includes a high-speed signal layer 1 709, a ground plane layer 2 710, and a high-speed signal layer 3 711 for carrying all high speed signals that route completely on the high-speed A-layer 705 or the high-speed B-layer 706. A power core 712 is formed of two of the eight conductive layers: a ground plane layer 4 713 and a VCC power plane 714 in layer 5. The B-layer 706 includes a high-speed signal layer 6 715, a ground plane layer 7 716, and a high-speed signal layer 8 717.

In various embodiments, the VCC power plane 714 is patterned so that channeled capacitive plane structures are formed in the four high-speed routing layers 704, advantageously forming capacitive structures flexibly in strategic positions throughout a circuit design.

Figure 8:
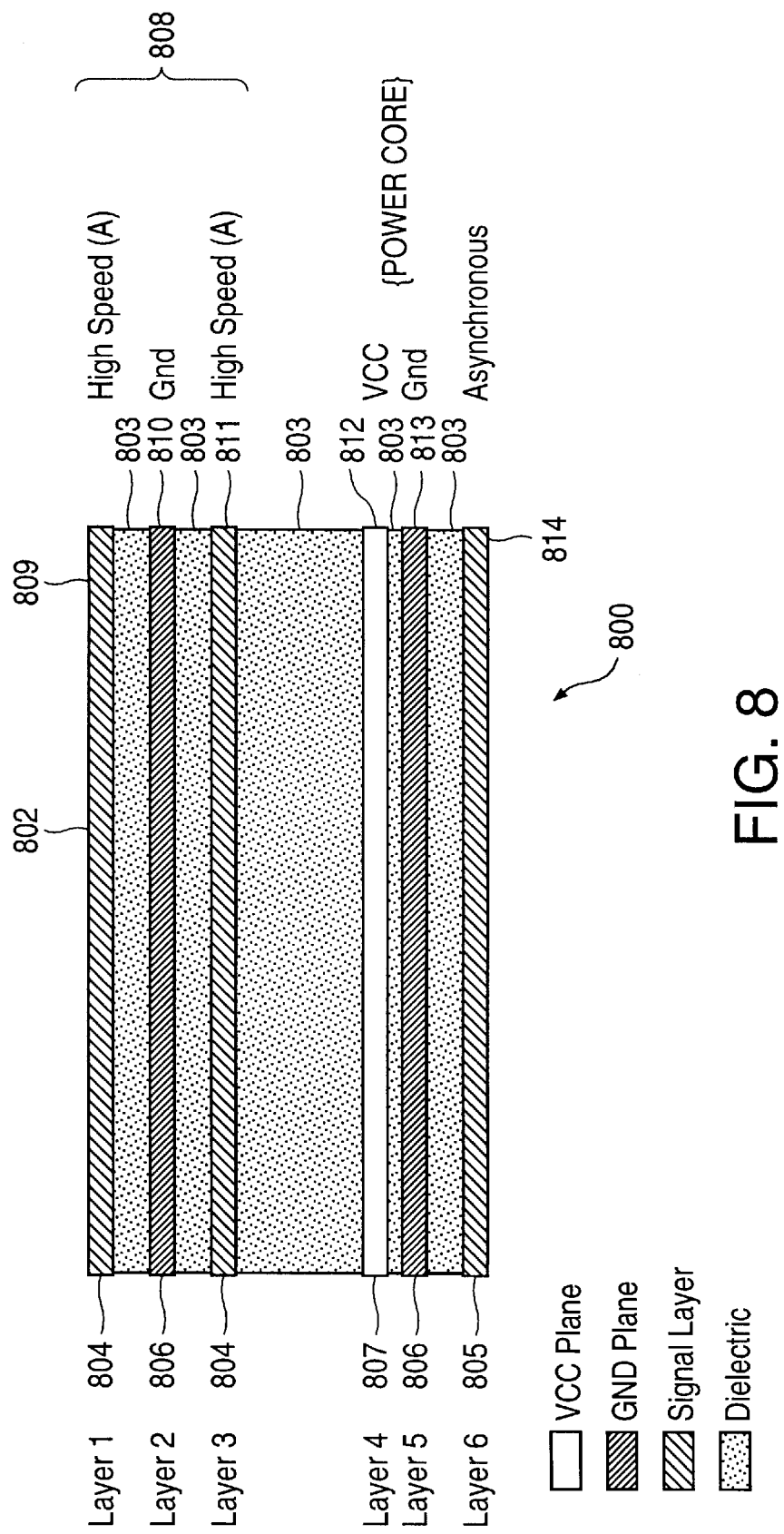
FIG. 8 is a cross-sectional view illustrating a multiple layer printed circuit board structure in the form of a six-layer channeled capacitive plane stack.

Referring to FIG. 8, a cross-sectional view illustrates a multiple layer printed circuit board structure 800 in the form of a six-layer channeled capacitive plane stack 802 having six conductive layers separated by intermediate dielectric layers 803. The six conductive layers include two high-speed routing layers 804, one asynchronous routing layer 805, two ground planes 806, and a VCC power plane 807. A high-speed pair 808 includes a high-speed signal layer 1 809, a ground plane layer 2 810, and a high-speed signal layer 3 811 for carrying all high-speed, high-risk signals. A power core 812 is formed of two of the six conductive layers: a ground plane layer 4 813 and a VCC power plane 814 in layer 5. The asynchronous routing layer 805 is typically reserved for low risk signals such as asynchronous glue logic.

Figure 9:
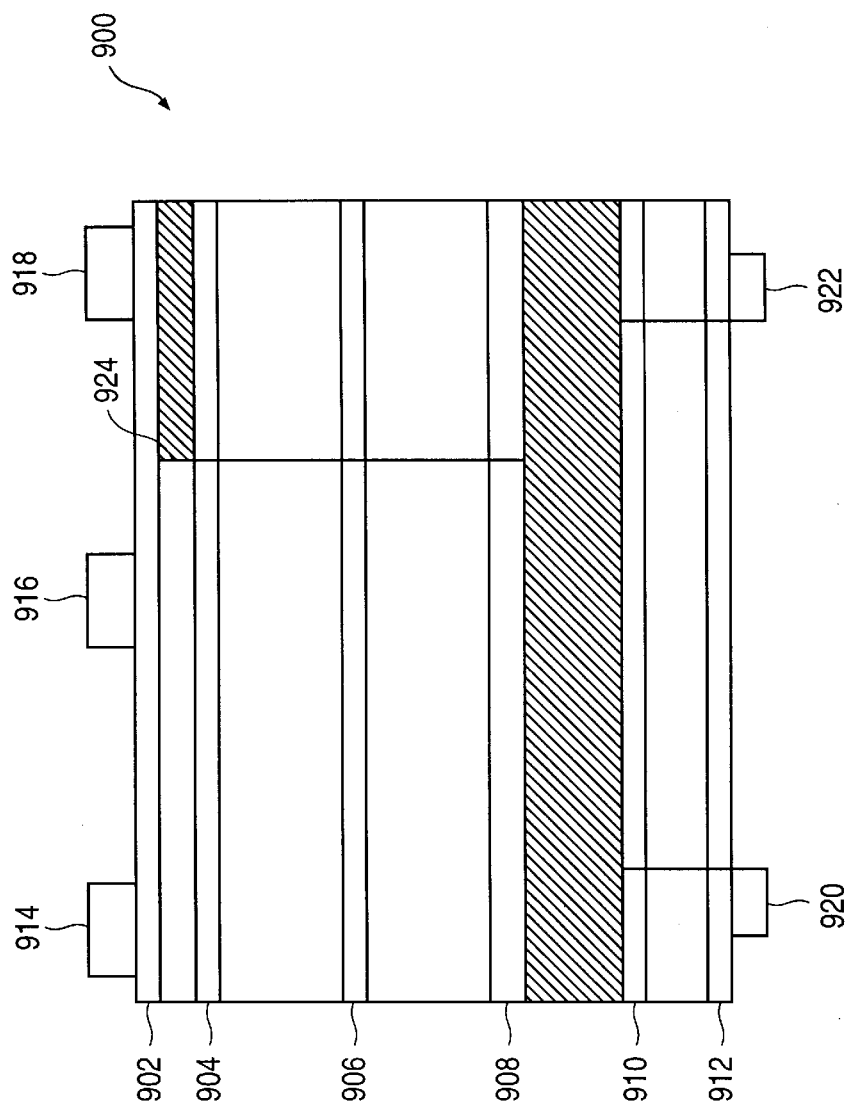
FIG. 9 is a schematic cross-sectional view of a printed circuit board illustrates a method of channeling current in three dimensions.

Referring to FIG. 9, a schematic cross-sectional view of a printed circuit board 900 illustrates a method of channeling current in three dimensions. The printed circuit board 900 includes a plurality of conductive layers including a signal plane 1 902, a ground plane 2 904, a signal plane 3 906, a power plane 4 908, a ground plane 5 910, and a signal plane 6 912. Several integrated circuit chips, represented as loads L1 914, L2 916, L3 918, L4 920, and L5 922 are mounted on the printed circuit board 900. Current is channeled from the power plane 4 908 through a via 924 to supply power to loads L3 918, L4 920, and L5 922 while electromagnetic emissions are reduced by suitably laying out the geometry of the power plane 4 908 and the signal plane 1 902 to form channeling capacitive planes.

Figure 10:
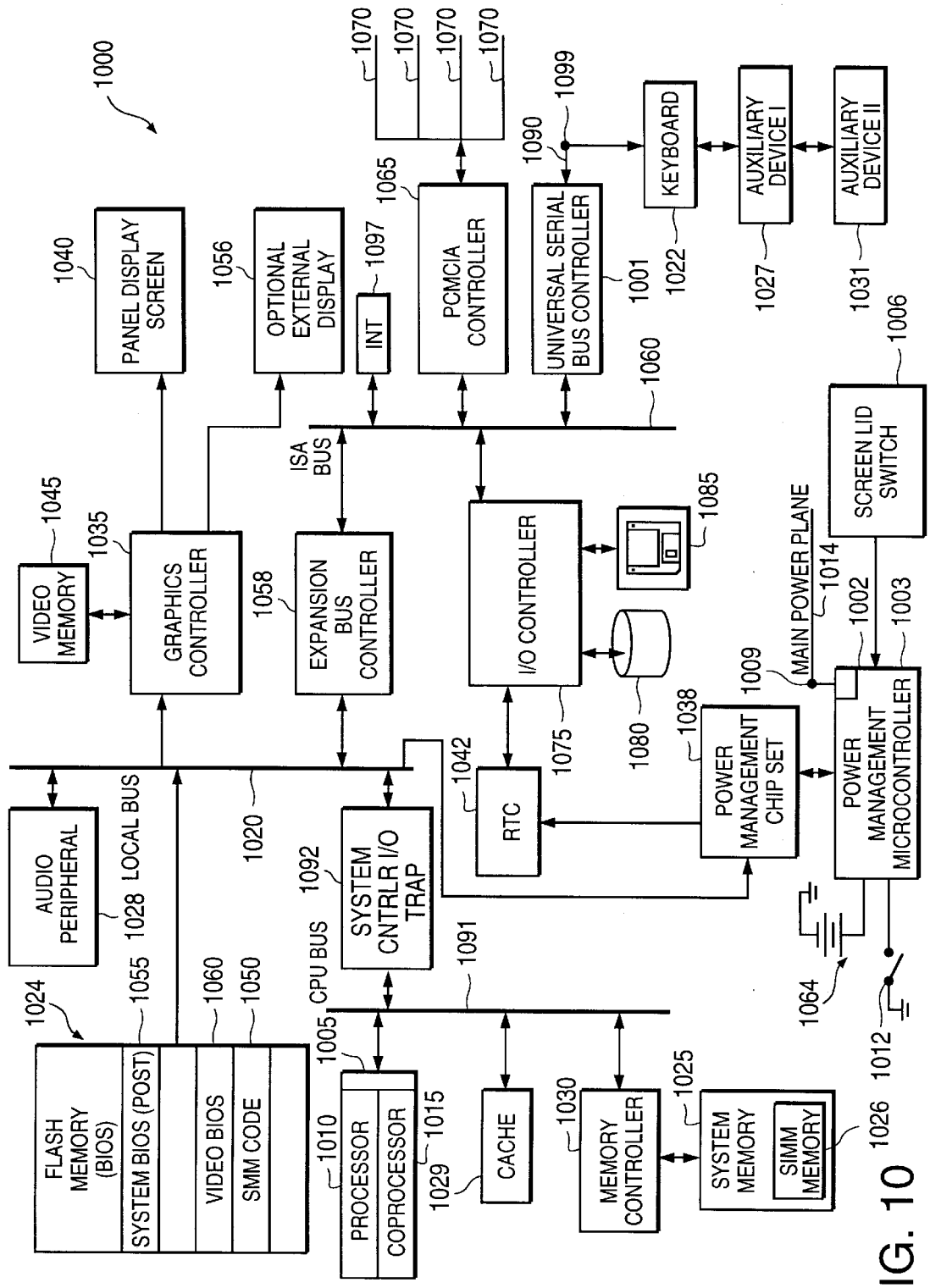
FIG. 10 is a schematic block diagram illustrating a computer system including a circuit for controlling current flow in an AC adapter.

Referring to FIG. 10, a schematic block diagram illustrates a computer system 1000 including a circuit 1002 for controlling current flow in a printed circuit board and reducing electromagnetic emissions. The computer system 1000 includes a microprocessor 1005 which may also be called a CPU. In some embodiments, the microprocessor 1005 is, for example, an Intel™ Pentium class microprocessor or Intel™ 80486 class microprocessor. The microprocessor 1005 has a processor 1010 for calculating integer operations and a coprocessor 1015 for calculating floating point operations. Microprocessor 1005 is connected to a cache 1029 and a memory controller 1030 via a CPU bus 1091. The cache 1029 may include both a primary cache (not shown) and a secondary cache (not shown).

A system controller I/O trap circuit 1092 connects the CPU bus 1091 to a local bus 1020. The system controller I/O trap circuit 1092 is generally characterized as part of a system controller such as a Pico Power Vesuvious or an Intel™ Mobile Triton chip set. In some embodiments, the system controller I/O trap circuit 1092 is programmed to intercept a particular target address or address range. Upon intercepting a target address, the system controller I/O trap circuit 1092 asserts an intercept signal indicating that the microprocessor 1005 has attempted to access the target address.

In the some embodiments, the intercept signal is connected to an SMI ("system management interrupt") pin of the microprocessor 1005, causing the microprocessor 1005 to enter system management mode ("SMM").

A main memory 1025, typically assembled from a plurality of dynamic random access memory ("DRAM") modules, is connected to the local bus 1020 by a memory controller 1030. The main memory 1025 includes a system management mode memory area which is employed to store converter code to implement conversion methodology embodiments as will be discussed in more detail subsequently.

A Basic Input Output System ("BIOS") memory 1024 is connected to local bus 1020. A FLASH memory or other nonvolatile memory is used as BIOS memory 1024. BIOS memory 1024 stores the system code which controls some operations of the computer system 1000.

An audio peripheral 1028 is connected to the local bus 1020 and is included in the computer system 1000 for generating or synthesizes musical signals or sound signals. The audio peripheral 1028 also includes amplifiers (not shown) and (filters) for producing sound from the synthesized musical or sound signals. By nature the audio peripheral 1028 includes circuits that attract and amplify extraneous signals, creating a distorted sound when nonmusical signals such as power signals or communication signals are attracted to the sound peripheral 1028, amplified and produced at a speaker. The illustrative multiple layer printed circuit board structure is employed to channel radio frequency power away from the audio peripheral 1028 region of the computer system 1000, thereby reducing overall noise emitted by the computer system 1000.

A graphics controller 1035 is connected to the local bus 1020 and to a panel display screen 1040. The graphics controller 1035 is also connected to a video memory 1045 which stores information to be displayed on panel display 1040. The panel display 1040 is typically an active matrix or passive matrix liquid crystal display ("LCD") although other display technologies may be used as well. Graphics controller 1035 is optionally connected to an optional external display or standalone monitor display 1056. One example of a suitable graphics controller for usage as the graphics controller 1035 is the Western Digital WD90C24A graphics controller.

A bus interface controller or expansion bus controller 1058 connects the local bus 1020 to an expansion bus 1060. In the illustrative embodiment, expansion bus 1060 is an Industry Standard Architecture ("ISA") bus although other buses, for example, a Peripheral Component Interconnect ("PCI") bus, may otherwise be used. A PCMCIA ("Personal Computer Memory Card International Association") controller 1065 is connected to expansion bus 1060. The PCMCIA controller 1065 is connected to a plurality of expansion slots 1070 to receive PCMCIA expansion cards such as modems, fax cards, communications cards, and other input/output devices. An interrupt request generator 1097 is also connected to the ISA bus 1060 and issues an interrupt service request over a predetermined interrupt request line after receiving a request signal from the processor 1005 requesting issuance of an interrupt.

An I/O controller 1075 is connected to ISA bus 1060. The I/O controller 1075 is interfaced to both an integrated drive electronics ("IDE") hard drive 1080 and a floppy diskette drive 1085.

A USB controller 1001 transfers data to and from the processor 1010 via the ISA bus 1060. A keyboard 1022, auxiliary device I, and auxiliary device II are connected serially to a USB connector 1099. This interconnection topology is implemented according to the USB technology standard. External devices which include keyboard 1022, auxiliary device I, and auxiliary device II communicate with microprocessor 1005 via the USB controller 1001. Auxiliary devices are typically communication devices such as a mouse, a modem, a joystick, or another computer system. When USB controller 1001 receives data from the connected external devices, USB controller 1001 issues an interrupt request to the microprocessor 1005. The microprocessor 1005 interprets the interrupt request as a request for service from a conventional communication interface and attempts to process the interrupt request accordingly. However, a USB servicing routine is executed instead.

The computer system 1000 includes a power supply 1064, such as a battery, which supplies operating power to the many devices of the computer system 1000. The power supply 1064 in the computer system 1000 is a rechargeable battery, such as a nickel metal hydride ("NiMH") or lithium ion battery. The power supply 1064 is connected to a power management microcontroller 1008 which operates in the manner of an AC line adapter and controls the distribution of power from power supply 1064. More specifically, the power control microcontroller 1008 includes a power output terminal 1009 connected to a main power plane 1014 which supplies power to microprocessor 1005. The power management microcontroller 1008 is also connected to a power plane (not shown) supplying operating power to panel display 1040. In the illustrative embodiment, the power control microcontroller 1008 is a Motorola 6805 microcontroller. The power control microcontroller 1008 monitors the charge level of the power supply 1064 to determine when to charge a battery 1064 and when to deny a charging voltage to the battery 1064. The power control microcontroller 1008 is connected to a main power switch 1012 which the user actuates to turn on or shut off the computer system 1000. While the power control microcontroller 1008 powers down other portions of the computer system 1000 such as hard drive 1080 when not in use to conserve power, the power control microcontroller 1008 itself is always connected to a source of energy, namely power supply 1064.

The computer system 1000 also includes a screen lid switch 1006 or indicator for indicating when the panel display 1040 is in the open or closed positions. The panel display 1040 is generally located in the typical lid location for "clamshell" types of computers such as laptop or notebook computers. The panel display 1040 forms an integral part of the lid of the computer and is set in either an open position with the screen accessible for usage or a closed condition for storage and porting.

The computer system 1000 also includes a power management chip set 1038 which includes power management chip models PT86C521 and PT86C22 manufactured by Pico Power. The power management chip set 1038 is connected to microprocessor 1005 via local bus 1020 so that the power management chip set 1038 receives power control commands from microprocessor 1005. The power management chip set 1038 is connected to a plurality of individual power planes supplying power to respective devices in the computer system 1000 such as the hard drive 1080 and floppy diskette drive 1085, for example. The power management chip set 1038 operates under control of the microprocessor 1005 to control the power to the various power planes and devices of the computer. A real time clock ("RTC") 1040 is connected to the I/O controller 1075 and the power management chip set 1038 so that time events or alarms are transmitted to the power management chip set 1038. The real time clock 1040 is typically programmed to generate an alarm signal at a predetermined time.

When the computer system 1000 is turned on or powered up, the system BIOS software stored in non-volatile BIOS memory 1024 is copied into main memory 1025 to execute instructions more quickly in a technique called "shadowing" or "shadow RAM". At this time, an SMM program code 1050 is also copied into the system management mode memory area 1026 of main memory 1025. The microprocessor 1005 executes SMM code 1050 after the microprocessor 1005 receives a system management interrupt ("SMI") which causes the microprocessor to enter system management mode (SMM) operation. In addition to the SMM code 1050, a video BIOS 1062 and a system BIOS program code 1055 including a power-on self-test (POST) module are stored in the BIOS memory 1024 and copied into main memory 1025 at power-up. Alternative memory mapping schemes may also be used. For example, SMM code 1050 may be stored in fast SRAM memory (not shown) connected to the local/CPU bus 1020.

While the invention has been described with reference to various embodiments, it will be understood that these embodiments are illustrative and that the scope of the invention is not limited to them. Many variations, modifications, additions and improvements of the embodiments described are possible.

What is claimed is:

1. A printed circuit board comprising:
    a plurality of planar conductive layers arranged in a mutually parallel sequence; and
    a plurality of planar insulative layers separating the plurality of planar conductive layers, the planar insulative layers having variable and controlled widths;
    the plurality of planar conductive layers including a power plane layer for supplying operating power throughout the planar conductive layers;
    the power plane layer including a plurality of separated segments in selected geometric patterns;
    the plurality of planar conductive layers including a plurality of signal plane layers for communicating operational signals throughout the planar conductive layers;
    the plurality of signal plane layers including a plurality of separated channeled capacitive plane segments in selected geometric patterns; and
    the geometric patterns in the channeled capacitive plane segments, the geometric patterns in the power plane layer, and the insulative layer variable width being controlled to control VHF electrical currents in three dimensions.

2. A printed circuit board according to claim 1, further comprising:
    a plurality of vias interconnecting layers of the plurality of planar conductive layers, the plurality of vias being interconnected to control VHF electrical currents in three dimensions.

3. A printed circuit board according to claim 1, further comprising:
    a plurality of vias interconnecting layers of the plurality of planar conductive layers, the plurality of vias being interconnected to control VHF electrical currents in three dimensions.

4. A printed circuit board according to claim 1, wherein:
    the plurality of planar conductive layers includes:
        a power plane;
        a plurality of signal plane layers; and
        a plurality of ground plane layers.

5. A printed circuit board according to claim 1, wherein:
    the geometric patterns in the channeled capacitive plane segments, the geometric patterns in the power plane layer, and the insulative layer variable width are selected to control voltages and currents by channeling a capacitance capacity for usage directed to a particular integrated circuit or circuits, isolated to a particular integrated circuit or circuits, or shared between integrated circuits.

6. A printed circuit board according to claim 1, wherein:
    the geometric patterns in the channeled capacitive plane segments, the geometric patterns in the power plane layer, and the insulative layer variable width are selected to form a plurality of potential capacitive planes on a plurality of layers in a single multiple layer or printed circuit board (PCB) design and direction of the EMI fluxes includes an effect of channeling EMI fluxes from layer to layer within the printed circuit board.

7. A printed circuit board according to claim 1, wherein:
    the geometric patterns in the channeled capacitive plane segments, the geometric patterns in the power plane layer, and the insulative layer variable width are selected to form a plurality of individual power planes in a printed circuit board whereby EMI fluxes of the individual power planes are channeled or directed within a single capacitive plane pair to improve electromagnetic field suppression and stabilize voltages applied to integrated circuits.

8. A printed circuit board according to claim 1, wherein:
    the geometric patterns in the channeled capacitive plane segments, the geometric patterns in the power plane layer, and the insulative layer variable width are selected to control mutual inductance and frequency response of a capacitive plane.

9. A printed circuit board according to claim 1, wherein:
    the geometric patterns in the channeled capacitive plane segments, the geometric patterns in the power plane layer, and the insulative layer variable width are selected to reduce power plane radio frequency (RF) crosstalk at the interface between a processor and an audio interface within a computer system, thereby improving signal-to-noise ratio of the system.

10. A printed circuit board according to claim 1, wherein:
    the geometric patterns in the channeled capacitive plane segments, the geometric patterns in the power plane layer, and the insulative layer variable width are selected to form capacitive planes that are smaller in area than the printed circuit board to share usage of a layer or layers among other interconnections including buses, slow logic, and clock microstrip systems.

11. A printed circuit board according to claim 1, wherein:
    the geometric patterns in the channeled capacitive plane segments, the geometric patterns in the power plane layer, and the insulative layer variable width are selected to control usage of radio frequency (RF) power.

12. A method of fabricating a printed circuit board comprising the steps of:
    laying out a plurality of planar conductive layers including a power plane layer for supplying operating power throughout the planar conductive layers;
    laying out a power plane layer including a plurality of separated segments in selected geometric patterns;
    laying out a plurality of planar insulative layers having variable and controlled widths;
    controlling the geometric patterns and the insulative layer variable width to control VHF electrical currents in three dimensions;
    forming a plurality of planar conductive layers arranged in a mutually parallel sequence;

forming a plurality of planar insulative layers separating the plurality of planar conductive layers, the planar insulative layers having the variable and controlled widths;

laying out the plurality of planar conductive layers to include a plurality of signal plane layers for communicating operational signals throughout the planar conductive layers;

laying out the plurality of signal plane layers to include a plurality of separated channeled capacitive plane segments in selected geometric patterns; and controlling the geometric patterns in the channeled capacitive plane segments, the geometric patterns in the power plane layer, and the insulative layer variable width to determine electrical currents in three dimensions.

13. A method according to claim 12, further comprising the steps of:

interconnecting a plurality of vias interconnecting layers of the plurality of planar conductive layers to control VHF electrical currents in three dimensions.

14. A method according to claim 12, further comprising the steps of:

interconnecting a plurality of vias interconnecting layers of the plurality of planar conductive layers to control VHF electrical currents in three dimensions.

15. A method according to claim 12, further comprising the steps of:

forming the plurality of planar conductive layers including the steps of:
forming a power plane;
forming a plurality of signal plane layers; and
forming a plurality of ground plane layers.

16. A method according to claim 12, further comprising the steps of:

selecting the geometric patterns in the channeled capacitive plane segments, the geometric patterns in the power plane layer, and the insulative layer variable width to control voltages and currents by channeling a capacitance capacity for usage directed to a particular integrated circuit or circuits, isolated to a particular integrated circuit or circuits, or shared between integrated circuits.

17. A method according to claim 12, further comprising the steps of:

selecting the geometric patterns in the channeled capacitive plane segments, the geometric patterns in the power plane layer, and the insulative layer variable width to form a plurality of potential capacitive planes on a plurality of layers in a single multiple layer or printed circuit board (PCB) design and direction of the EMI fluxes includes an effect of channeling EMI fluxes from layer to layer within the printed circuit board.

18. A method according to claim 12, further comprising the steps of:

selecting the geometric patterns in the channeled capacitive plane segments, the geometric patterns in the power plane layer, and the insulative layer variable width to form a plurality of individual power planes in a printed circuit board with EMI fluxes of the individual power planes are channeled or directed within a single capacitive plane pair to allow a plurality of potentials and integrated circuits which form loads applied to the plurality of potentials to improve electromagnetic field suppression and stabilize voltages applied to integrated circuits.

19. A method according to claim 12, further comprising the steps of:

selecting the geometric patterns in the channeled capacitive plane segments, the geometric patterns in the power plane layer, and the insulative layer variable width to control mutual inductance and frequency response of a capacitive plane.

20. A method according to claim 12, further comprising the steps of:

selecting the geometric patterns in the channeled capacitive plane segments, the geometric patterns in the power plane layer, and the insulative layer variable width to reduce power plane radio frequency (RF) crosstalk at the interface between a processor and an audio interface within a computer system, thereby improving signal-to-noise ratio of the system.

21. A method according to claim 12, further comprising the steps of:

selecting the geometric patterns in the channeled capacitive plane segments, the geometric patterns in the power plane layer, and the insulative layer variable width to form capacitive planes that are smaller in area than the printed circuit board to share usage of a layer or layers among other interconnections including buses, slow logic, and clock microstrip systems.

22. A method according to claim 12, further comprising the steps of:

selecting the geometric patterns in the channeled capacitive plane segments, the geometric patterns in the power plane layer, and the insulative layer variable width to control usage of radio frequency (RF) power.

23. A computer system comprising:

a plurality of integrated circuit chips including a processor;

a printed circuit board for mounting at least some of the plurality of integrated circuit chips, the printed circuit board including:
a plurality of planar conductive layers arranged in a mutually parallel sequence; and
a plurality of planar insulative layers separating the plurality of planar conductive layers, the planar insulative layers having variable and controlled widths;
the plurality of planar conductive layers including a power plane layer for supplying operating power throughout the planar conductive layers;
the power plane layer including a plurality of separated segments in selected geometric patterns;
the plurality of planar conductive layers including a plurality of signal plane layers for communicating operational signals throughout the planar conductive layers;
the plurality of signal plane layers including a plurality of separated channeled capacitive plane segments in selected geometric patterns; and
the geometric patterns in the channeled capacitive plane segments, the geometric patterns in the power plane layer, and the insulative layer variable width being controlled to control VHF electrical currents in three dimensions.

24. A computer system according to claim 23 wherein:

placement of the at least some of the plurality of integrated circuit chips is controlled to control VHF electrical currents in three dimensions.

25. A computer system according to claim 23, further comprising:

a plurality of vias interconnecting layers of the plurality of planar conductive layers, the plurality of vias being interconnected to control VHF electrical currents in three dimensions.

26. A computer system according to claim 23, further comprising:

a plurality of vias interconnecting layers of the plurality of planar conductive layers, the plurality of vias being interconnected to control VHF electrical currents in three dimensions.

27. A computer system according to claim 23, wherein:

the plurality of planar conductive layers includes:
a power plane;
a plurality of signal plane layers; and
a plurality of ground plane layers.

28. A computer system according to claim 23, wherein:

the geometric patterns in the channeled capacitive plane segments, the geometric patterns in the power plane layer, and the insulative layer variable width are selected to control voltages and currents by channeling a capacitance capacity for usage directed to a particular integrated circuit or circuits, isolated to a particular integrated circuit or circuits, or shared between integrated circuits.

29. A computer system according to claim 23, wherein:

the geometric patterns in the channeled capacitive plane segments, the geometric patterns in the power plane layer, and the insulative layer variable width are selected to form a plurality of potential capacitive planes on a plurality of layers in a single multiple layer or printed circuit board (PCB) design and direction of the EMI fluxes includes an effect of channeling EMI fluxes from layer to layer within the printed circuit board.

30. A computer system according to claim 23, wherein:

the geometric patterns in the channeled capacitive plane segments, the geometric patterns in the power plane layer, and the insulative layer variable width are selected to form a plurality of individual power planes in a printed circuit board whereby EMI fluxes of the individual power planes are channeled or directed within a single capacitive plane pair to improve electromagnetic field suppression and stabilize voltages applied to integrated circuits.

31. A computer system according to claim 23, wherein:

the geometric patterns in the channeled capacitive plane segments, the geometric patterns in the power plane layer, and the insulative layer variable width are selected to control mutual inductance and frequency response of a capacitive plane.

32. A computer system according to claim 23, wherein:

the geometric patterns in the channeled capacitive plane segments, the geometric patterns in the power plane layer, and the insulative layer variable width are selected to reduce power plane radio frequency (RF) crosstalk at the interface between a processor and an audio interface within a computer system, thereby improving signal-to-noise ratio of the system.

33. A computer system according to claim 23, wherein:

the geometric patterns in the channeled capacitive plane segments, the geometric patterns in the power plane layer, and the insulative layer variable width are selected to form capacitive planes that are smaller in area than the printed circuit board to share usage of a layer or layers among other interconnections including buses, slow logic, and clock microstrip systems.

34. A computer system according to claim 23, wherein:

the geometric patterns in the channeled capacitive plane segments, the geometric patterns in the power plane layer, and the insulative layer variable width are selected to control usage of radio frequency (RF) power.

* * * * *